(12) United States Patent
Suzuki et al.

(10) Patent No.: US 7,691,277 B2
(45) Date of Patent: Apr. 6, 2010

(54) QUARTZ COMPONENT FOR PLASMA PROCESSING APPARATUS AND RESTORING METHOD THEREOF

(75) Inventors: Katsunori Suzuki, Mihama-ku (JP); Kenji Nakamura, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 128 days.

(21) Appl. No.: 12/071,041

(22) Filed: Feb. 14, 2008

(65) Prior Publication Data
US 2008/0206452 A1 Aug. 28, 2008

Related U.S. Application Data

(62) Division of application No. 10/790,188, filed on Mar. 2, 2004, now abandoned.

(30) Foreign Application Priority Data
Mar. 3, 2003 (JP) .............................. 2003-055620

(51) Int. Cl.
*H01L 21/302* (2006.01)
*B24B 1/00* (2006.01)

(52) U.S. Cl. .............................. 216/52; 216/13; 451/41; 438/689; 438/905; 134/1; 134/22.1; 427/140

(58) Field of Classification Search .................. None
See application file for complete search history.

(56) References Cited

U.S. PATENT DOCUMENTS

| | | | |
|---|---|---|---|
| 5,262,029 A | 11/1993 | Erskine et al. | |
| 5,529,657 A | 6/1996 | Ishii | |
| 5,748,434 A | 5/1998 | Rossman et al. | |
| 5,919,332 A | 7/1999 | Koshiishi et al. | |
| 5,942,039 A | 8/1999 | Kholodenko et al. | |
| 6,039,836 A | 3/2000 | Dhindsa et al. | |
| 6,284,093 B1 | 9/2001 | Ke et al. | |
| 6,364,957 B1 | 4/2002 | Schneider et al. | |
| 6,391,787 B1 | 5/2002 | Dhindsa et al. | |
| 6,447,853 B1 * | 9/2002 | Suzuki et al. | 427/585 |
| 6,508,199 B1 | 1/2003 | Oyabu et al. | |
| 6,846,726 B2 | 1/2005 | Ren et al. | |
| 6,992,011 B2 * | 1/2006 | Nemoto et al. | 438/706 |
| 7,541,094 B1 * | 6/2009 | Zuck et al. | 428/446 |
| 2002/0139478 A1 | 10/2002 | Ma et al. | |
| 2002/0185658 A1 | 12/2002 | Inoue et al. | |
| 2003/0029565 A1 | 2/2003 | Suzuki et al. | |
| 2003/0221702 A1 * | 12/2003 | Peebles | 134/1 |
| 2004/0045574 A1 * | 3/2004 | Tan | 134/1 |
| 2004/0238487 A1 * | 12/2004 | Kiehlbauch et al. | 216/52 |
| 2005/0045209 A1 * | 3/2005 | Tan | 134/18 |
| 2005/0238807 A1 * | 10/2005 | Lin et al. | 427/248.1 |
| 2005/0274396 A1 * | 12/2005 | Shih et al. | 134/29 |
| 2007/0014949 A1 * | 1/2007 | Bhatnagar et al. | 428/34.4 |

FOREIGN PATENT DOCUMENTS

JP    A-10-265977    10/1998

* cited by examiner

*Primary Examiner*—Anita K Alanko
(74) *Attorney, Agent, or Firm*—Oliff & Berridge, PLC

(57) ABSTRACT

The main surface of a quartz component is divided by an offset into a first region having a larger height around an inner perimeter and a second region adjacent to the outer perimeter of the first region. Repeated restoration of a damaged component by forming a bulge on the first region and machining the bulge to make a flat surface while maintaining the offset enables long term use of the component.

16 Claims, 11 Drawing Sheets

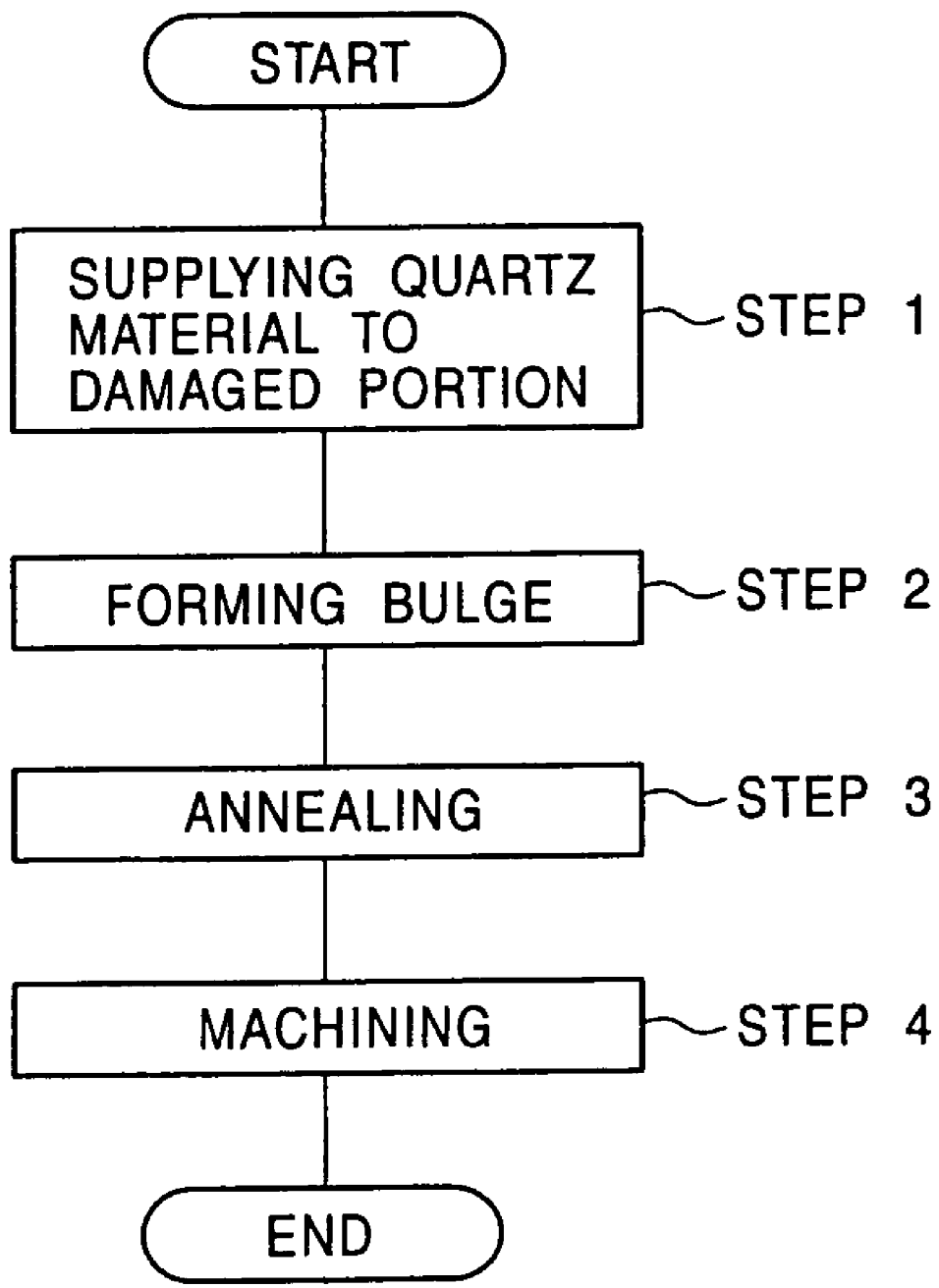

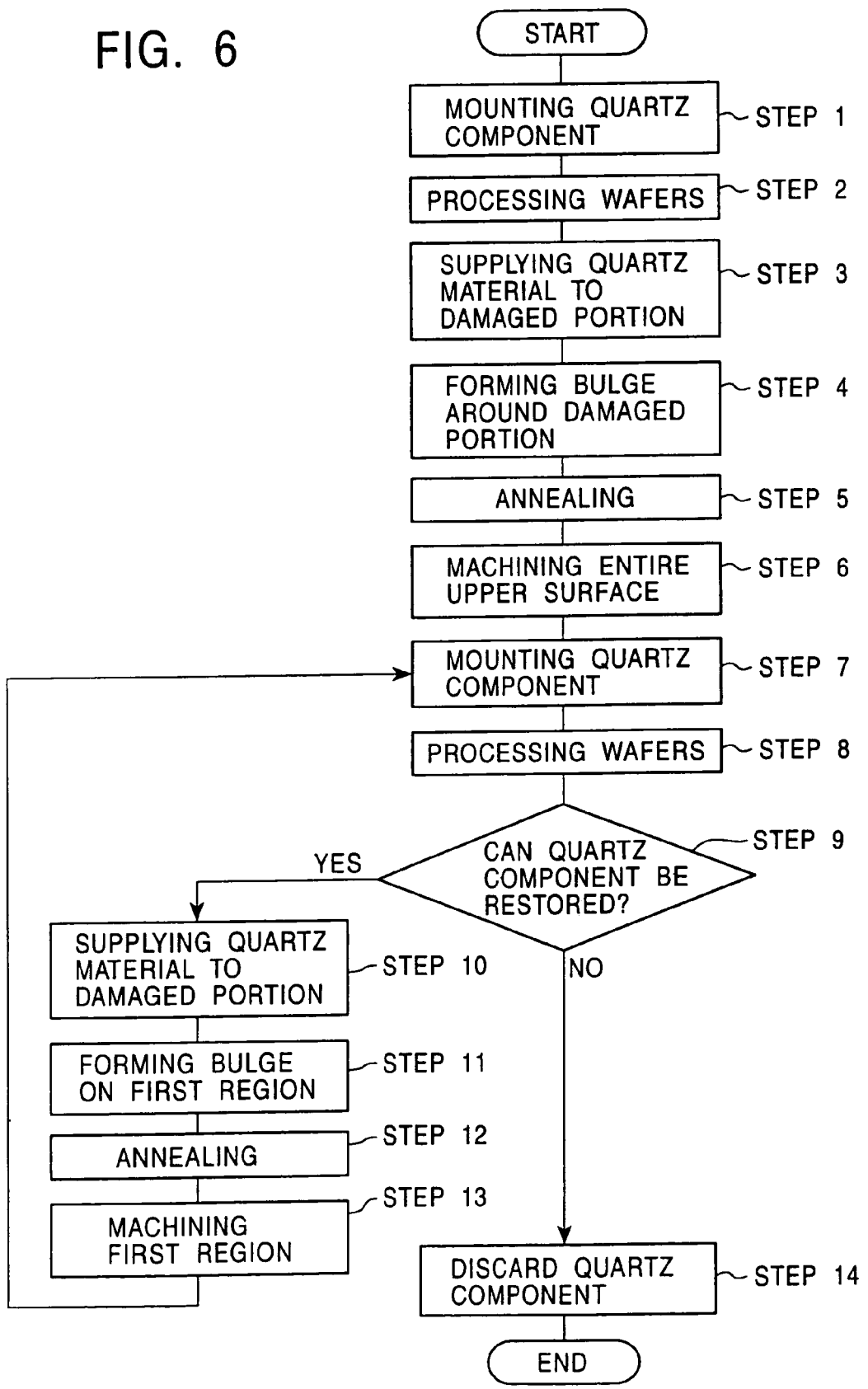

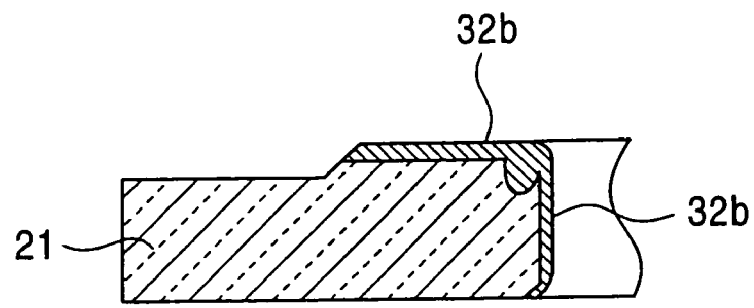
FIG. 8A
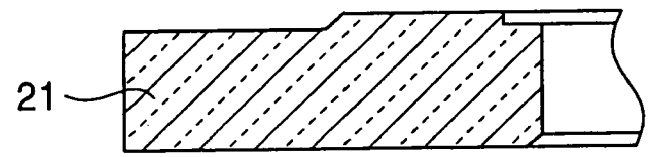
FIG. 8B
FIG. 9
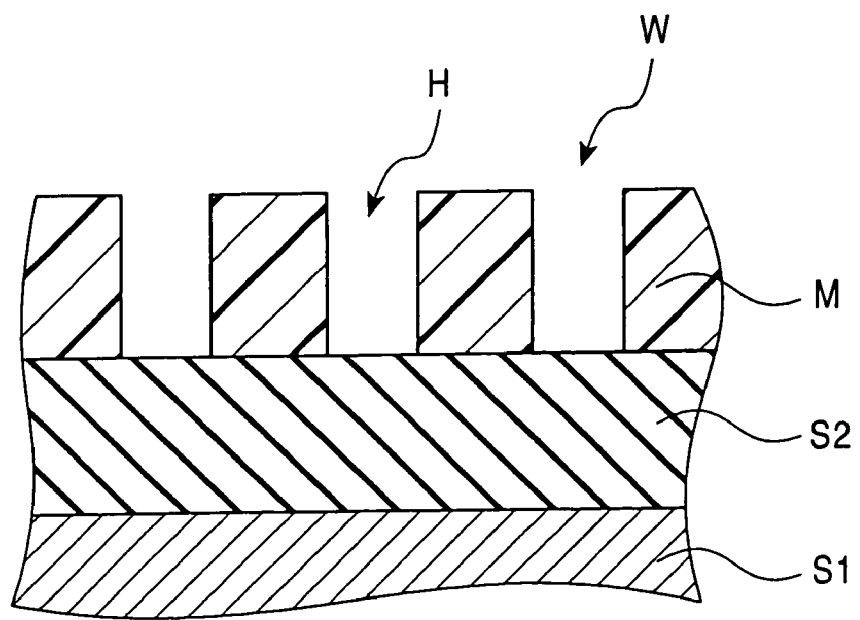

QUARTZ COMPONENT FOR PLASMA PROCESSING APPARATUS AND RESTORING METHOD THEREOF

This is a Division of application Ser. No. 10/790,188 filed Mar. 2, 2004 now abandoned. The disclosure of the prior application is hereby incorporated by reference herein in its entirety. This invention was first described in Japanese Patent Application No. 2003-55620, which is hereby incorporated by reference in its entirety.

BACKGROUND OF THE INVENTION

1. Field of Invention

This invention relates to a plasma processing technique for manufacturing semiconductor devices, and particularly to a quartz component employed in plasma processing apparatus. This invention also relates to a method for restoring the quartz component.

2. Description of Related Art

Plasma processes, such as dry etching, are widely employed in manufacturing semiconductor devices. For example, etching is generally performed using a reactive gas activated by plasma. In dry etching techniques, however, components within the chamber of a plasma processing apparatus are often damaged due to their exposure to the plasma. In particular, a dry etching apparatus for etching silicon oxide, which requires high-energy ions, presents a serious problem in that it damages the components.

The plasma chamber components are generally formed of materials, such as quartz, anodized aluminum, silicon, silicon carbide, carbon, a fluorine-polymer material, various kinds of ceramic materials, or the like. The selection of the material is made from the perspective of electric insulation, workability, impurity concentration, and the like. However, none of the aforementioned materials can completely eliminate the problem of plasma damage.

Accordingly, the components of a plasma processing apparatus that suffer plasma damage are treated as expendables and are managed on the basis of a predetermined duration of use. That is, the components that have reached the predetermined duration of use are replaced with new ones.

In the event that the user uses a plasma processing apparatus, including the chamber components, beyond their predetermined duration of use, the damaged components may create a problem of, for example, unstable plasma discharge.

The chamber components are designed to generate a suitable current path. When the plasma damages any of chamber components, new current paths are formed, leading to the problem that a desired plasma discharge cannot be sustained. Furthermore, the flow of reactive gas may be influenced due to the damage of the chamber components, and unwanted particles may be generated from the damaged components.

Usually, however, the plasma does not damage the entirety of a chamber component, but damages only a specific portion of the component. Accordingly, replacement of the entire chamber component leads to unnecessarily high costs, and to waste of resources.

Accordingly, an arrangement is proposed that divides a component in a plurality of parts. In particular, Japanese Unexamined Patent Application Publication No. 10-265977 proposes to divide the shield ring, which suffers from the most serious damage in the chamber components, into an inside component and an outside component. The inside component is located at a position where the inside component particularly suffers from particle adhesion and damage due to sputtering. By constructing the inside component with a material highly resistible to particle adhesion and sputtering, the lifetime and hence the cycle of replacement of the shield ring is extended.

However, dividing a single component into multiple sub-components increases the number of chamber components, and leads to a problem of increased management costs.

SUMMARY OF THE INVENTION

This invention has been made, according to various exemplary embodiments, in order to address the above-described problems, and accordingly, this invention provides a quartz component for a plasma processing apparatus, and a restoring method which enables restoration of the chamber components, and in particular, that enables repeated use of the component without adversely influencing the plasma process.

In order to address the above-described problems, the present invention provides, according to various exemplary embodiments:

A plate-shaped quartz component for use in a plasma processing apparatus is disclosed wherein the plate-shaped quartz component comprises an inner parameter, a main surface extending outwardly from the inner parameter, a first portion around the inner parameter, the first portion having a flat first region on the main surface and a second portion adjacent to an outer parameter of the first portion having a smaller thickness than that of the first portion, the second portion having a second region adjacent to the first region on the main surface, the second region having a height lower than that of the first region.

A plasma processing apparatus is also disclosed, which comprises a processing chamber to accommodate the workpiece, an electrode within the process chamber to generate the plasma, the electrode having an outer parameter and a plate-shaped quartz component having an inner parameter that surrounds the outer parameter of the electrode.

Moreover, a method of restoring the plate-shaped quartz component used in a plasma processing apparatus is disclosed, which comprises forming a bulge of quartz material on a first region of the main surface such that the main surface is divided into the first region and a second region adjacent to the first region by an offset, and machining the main surface having the bulges such that a flat surface is formed in the first region while maintaining the offset. Also, a method for manufacturing semiconductor devices is disclosed, the method comprising mounting a plate-shaped quartz component in the plasma processing apparatus, processing a certain number of semiconductor wafers in the apparatus, and restoring the quartz component that much by the exposure to the plasma.

Finally, a method of using and restoring a plate-shaped quartz component is disclosed, the method comprising using the component in a plasma processing apparatus, restoring the used component including forming a bulge of quartz material on a portion of the main surface, and machining the main surface having the bulge such that the main surface becomes flat throughout the first region and the second region of the component, reusing the restored component in the apparatus and re-restoring the re-reused component including forming a bulge of quartz material on the first region such that the main surface of the component is divided into a first region and a second region by an offset, and machining the main surface having the bulge such that a flat surface is formed in the first region while maintaining the offset.

Thus, use of the component over a long period of time is enabled by repeating the restoration process of the component damaged due to its use within the plasma processing apparatus, thereby reducing the running costs of the plasma processing apparatus, and improving the efficiency of utilization of resources.

BRIEF DESCRIPTION OF THE DRAWINGS

FIG. 4 is a flowchart which shows a restoring method for a quartz component according to an aspect of the present invention;

FIG. 6 is a flowchart which shows a cycle of use and restoration of the quartz component according to an aspect of the present invention;

FIGS. 8A through 8B are longitudinal cross-sectional views which show the quartz components during the cycle of use and restoration according to an aspect of the present invention;

FIG. 9 is a longitudinal cross-sectional view which shows a semiconductor according to an aspect of the present invention;

DETAILED DESCRIPTION OF EXEMPLARY EMBODIMENTS

These and other features and advantages of this invention are described in, or are apparent from, the following detailed description of various exemplary embodiments of the systems and methods according to this invention.

First Embodiment

Description will be made below regarding a first exemplary embodiment according to this invention.

Figure 1:
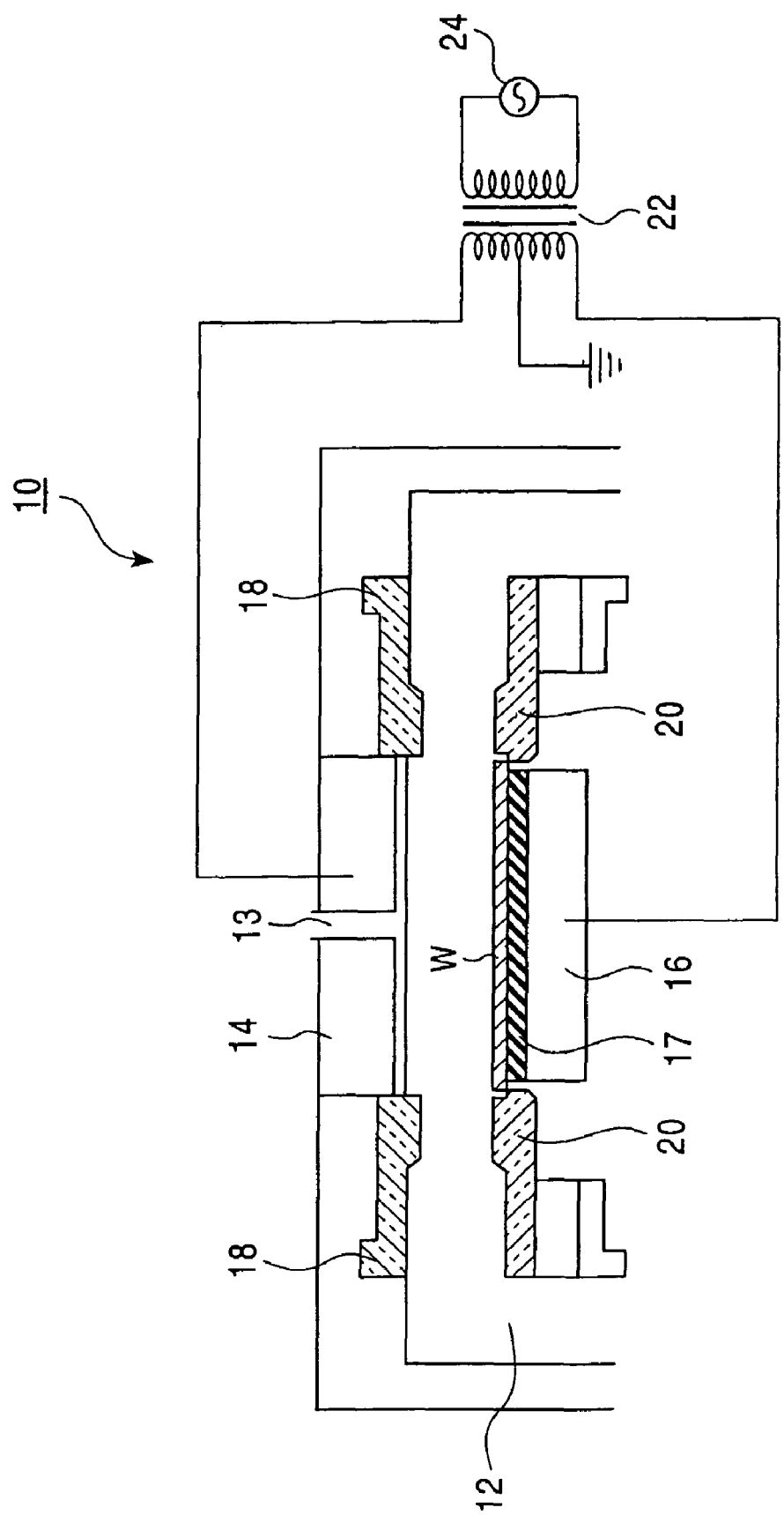
FIG. 1 is a cross-sectional diagram which shows a plasma processing apparatus according to an aspect of the present invention.

FIG. 1 is a schematic cross-sectional diagram of a plasma processing apparatus for performing dry etching according to an exemplary embodiment of this invention. As shown in FIG. 1, the plasma processing apparatus 10 performs etching using radio-frequency (RF) plasma. The plasma processing apparatus 10 has a parallel-plate-electrode configuration with the electrodes facing one another across a narrow gap.

The processing chamber 12 accommodates a silicon wafer W to be processed, and a vacuum of around $10^{-6}$ Torr ($10^{-4}$ Pa) can be established. The chamber 12 includes an upper electrode 14 at the upper middle thereof and a lower electrode 16 at the lower middle thereof. The upper electrode 14 is connected to a gas inlet 13 for introducing the etching gas. The lower electrode 16 has an electrostatic chuck 17 for mounting the wafer W which is to be etched.

The side surface of the outer perimeter of the lower electrode 16 is coated with an anodized aluminum layer and covered by a fluorine-polymer film, or the like, so as to ensure electric insulation of the lower electrode 16.

The upper electrode 14 and the lower electrode 16 are arranged parallel to each another. The surfaces of electrodes 14 and 16, which are facing one another, are flat. Thus, the electrodes form a parallel-plate-electrode configuration for generating plasma in a space between the upper and lower electrodes 14 and 16 by applying RF electric power.

The upper electrode 14 further includes shower nozzles (not shown) for uniformly supplying etching gas to the space between the upper and lower electrodes. The etching gas is guided to the outer portion of the chamber 12, and is evacuated at a controlled flow rate by an unshown pumping system. As a result, etching-gas atmosphere with a predetermined and constant pressure is produced in the space between the upper and lower electrodes.

Upon applying RF electric power to the etching-gas atmosphere through the electrodes, plasma is generated in the space between the upper electrode 14 and the lower electrode 16. Thus, RF plasma is generated within the chamber 12, and dry etching can therefore be performed.

For supplying the RF power, the plasma processing apparatus 10 includes an RF power supply 24 and an RF power splitter 22 for supplying the RF electric power to both the upper electrode 14 and the lower electrode 16. That is, a split-coupling configuration, in which the RF power is supplied to both the upper and the lower electrodes, is employed in the exemplary embodiment shown in FIG. 1. However, other configurations such as anode-coupling and cathode-coupling may also be employed.

The perimeters of the upper electrode 14 and the lower electrode 16 are surrounded by upper quartz component 18 and lower quartz component 20, respectively. The upper quartz component 18 serves as a shield ring, and the lower quartz component 20 serves as a focus ring, both of which have the function of focusing the plasma between the parallel-plate electrodes 14 and 16. The shield ring 18 and the focus ring 20 are detachably mounted onto the chamber 12.

The lower surface of the shield ring 18 and the upper surface of the focus ring 20, respectively, are generally the parts that are damaged due to exposure to the plasma. In particular, the inner perimeter of the lower and upper surfaces, which are positioned near the outer perimeter of the upper and lower electrodes 14 and 16, can be seriously damaged. Accordingly, the lower surface of the shield ring 18 and the upper face of the focus ring 20, respectively, are formed in a shape so as to facilitate their restoration.

Furthermore, as shown in FIG. 1, the shield ring 18 and the focus ring 20 are disposed such that the lower surface of the shield ring 18 and the upper surface of the focus ring 20 face one another, so as to form a path for guiding the etching gas from the space between the upper and lower electrodes to the outer portion of the chamber 12. Accordingly, the lower surface of the shield ring 18 and the upper surface of the focus ring 20 affect the flow of the etching gas. Therefore, the lower surface of the shield ring 18 and the upper surface of the focus ring 20 are formed in a shape so as not to significantly disturb the flow of the etching gas.

The lower surface of the shield ring 18 and the upper surface of the focus ring 20, which are readily damaged due to exposure to the plasma and which may affect the flow of the etching gas, will be referred to as "main surfaces" of the shield ring 18 and of the focus ring 20 hereafter.

Next, description will be made regarding the focus ring 20 according to an exemplary embodiment of this invention.

Figure 2A:
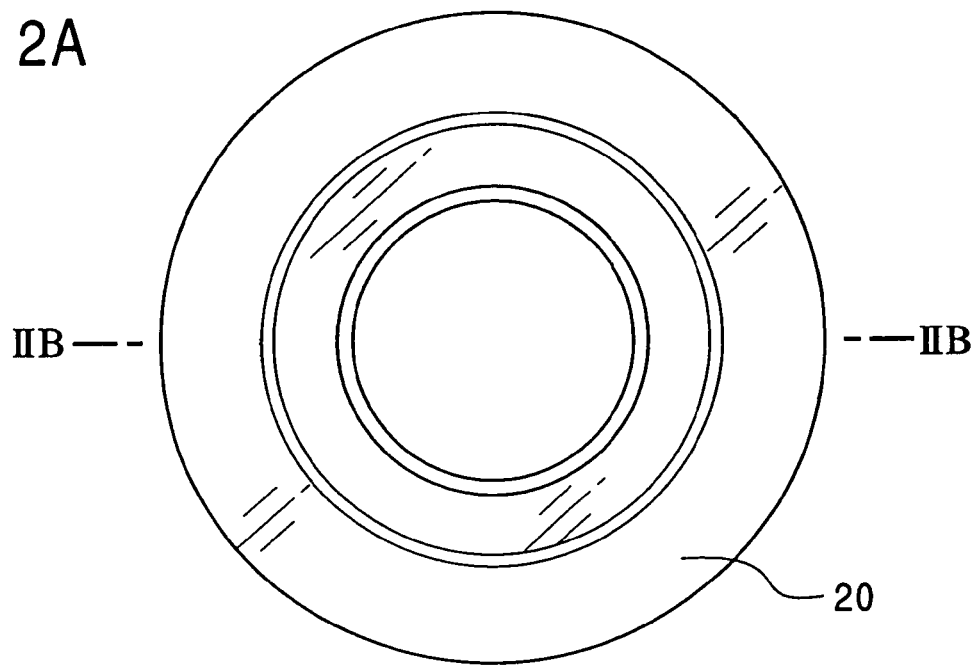
FIGS. 2A through 2C are a plan view and longitudinal cross-sectional views of a focus ring according to an aspect of the present invention.
Figure 2B:
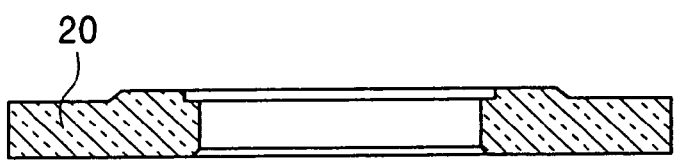
Figure 2C:
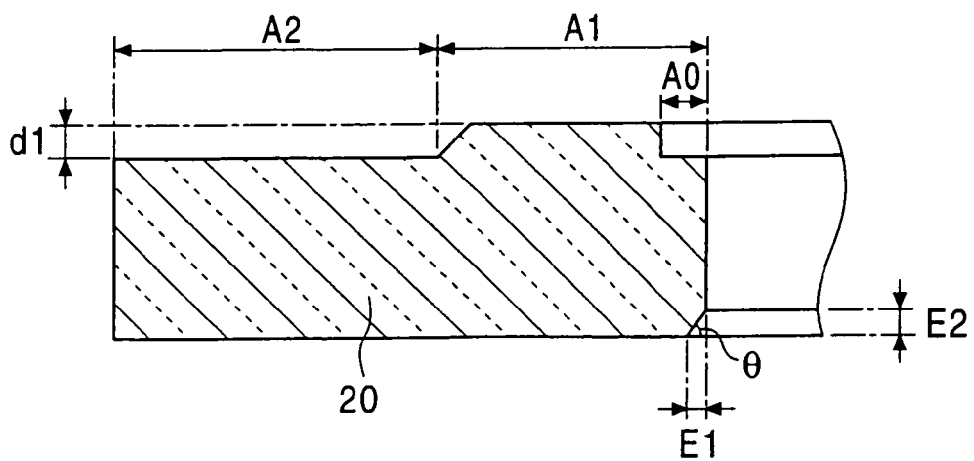

FIG. 2A is a plan view of the focus ring 20 according to the exemplary embodiment, FIG. 2B is a longitudinal cross-sectional view taken along the line IIB-IIB in FIG. 2A, and FIG. 2C is a partially enlarged cross-sectional view of the focus ring 20. The focus ring 20 is formed in the overall shape of a doughnut-shaped plate having an inner perimeter and an outer perimeter. The upper surface of the focus ring 20 serving as the main surface includes a ridge around the inner perimeter as shown in FIG. 2B.

More specifically, as shown in FIG. 2C, the focus ring 20 includes a first portion around the inner perimeter and a second portion adjacent to the outer perimeter of the first region. The first portion has a flat surface (first region A1) on the main surface, and the second portion also has a flat surface (second region A2) on the main surface.

The first region A1, which corresponds to the ridge, has a larger height than that of the second region A2, and the difference is height d1. In other words, the main surface of the focus ring 20 is divided into the first region A1 and the second region A2 by an offset d1.

The height of the offset d1 is determined such that the restoration process can be easily performed when the focus ring 20 becomes damaged due to exposure to the plasma after processing of a certain number of wafers W. At the same time, the height of the offset d1 does not significantly disturb the flow of the processing gas supplied to the space between the electrodes.

On the other hand, as shown in FIG. 2C, the side surface of the inner perimeter of the focus ring 20 is formed perpendicular to the main surface. At the time of mounting the focus ring 20 to the lower electrode 16 so as to surround the outer perimeter of the lower electrode 16, the side surface of the focus ring faces the side surface of the outer perimeter of the lower electrode 16. Thus, a gap with a predetermined width is formed, as shown in FIG. 1.

According to various exemplary embodiments, the focus ring 20 is formed such as to minimize the gap, thereby preventing damage of the side surface of the lower electrode 16 because of exposure to the plasma.

Furthermore, the focus ring 20 includes a stepped region A0 with a predetermined width within the region A1 on the inner-perimeter side, wherein the main surface of the region A0 is smaller than other portions on the region A1. The region A0 is formed so as to facilitate mounting of the wafer W on the lower electrode 16.

The lower electrode 16 is formed with a slightly smaller diameter than that of the wafer W, and accordingly, the outer perimeter of the wafer W mounted on the lower electrode 16 extends outwardly from the lower electrode 16, as shown in FIG. 1. The focus ring 20 includes the region A0 with the height of the main surface lower than that of the other portions of the region A1 in order to prevent chipping of the wafer W.

That is, as shown in FIG. 1, the focus ring 20 is mounted onto the lower electrode 16 such that the height of the first region A1 of the focus ring 20 becomes substantially flush with the surface of the wafer W mounted on the lower electrode 16. Therefore, if the entire portion of the region A1 is formed to have the same height, the outer perimeter of the wafer W will be pressed into contact with the main surface of the focus ring 20.

It should be noted that FIG. 2C shows an exemplary arrangement of the focus ring 20 in which the main surfaces of the regions A0 and A2 are formed with the same height. However, the configuration of the focus ring 20 is not limited to this exemplary arrangement.

The focus ring 20 according to various exemplary embodiments has generally the same configuration and generally the same functions as a conventional focus ring. The difference is that the main surface of a conventional focus ring is not divided into a first region A1 and a second region A2 by an offset, i.e., the entire main surface is formed flat, except for the region A0 along the inner perimeter for mounting the wafer W.

The configuration of the focus ring 20 where the main surface is divided into a first region A1 and a second region A2 by the offset d1, and where the first region A1 is made higher than the second region A2 enables repeated restorations of the focus ring 20, as described below.

Specifically, according to various exemplary embodiments, the offset d1 is preferably formed with a height of about 0.1 mm to about 2 mm, and is more preferably formed with a height of about 0.3 mm to about 1.7 mm. The offset d1 formed with a smaller height than the above described range may lead to difficulty in restoring the focus ring. On the other hand, an offset d1 formed with a greater height than the above described range may disturb the flow of the etching gas, leading to a problem of poor uniformity in the processing of wafers W.

It should be noted that FIG. 2C shows the offset d1 in an illustration that does not faithfully reproduce correct proportions. In general, the focus ring 20 is formed with a thickness of 12 mm, for example, which is far larger than the offset d1. Furthermore, the entire upper surface (main surface) is formed with a diameter of about 300 mm, for example, which is much larger than the height of the offset. Accordingly, while the focus ring 20 has an offset d1 with a small height, the focus ring 20 has generally the shape of a plate with a substantially uniform thickness, and has a generally flat main surface.

The main surface of the focus ring 20 is preferably divided into the first region A1 and the second region A2 with a width ratio (in the radial direction) of about 1:0.3 to about 1:0.2. More specifically, according to various exemplary embodiments, in a case where the main surface has the sum of the width of A1 and the width of A2 equal to 75 mm, the main surface is preferably divided into the region A1 with a width of about 25 to about 55 mm, and the region A2 with a width of about 20 to about 50 mm.

The main surface having the region A1 with a smaller width than this range may disturb the flow of processing gas. On the other hand, the main face having the region A1 with a greater width than this range may lead to a problem of increased restoration costs.

The focus ring 20 includes a beveled portion on the lower surface along the inner perimeter. As shown in FIG. 2C, the beveled portion extends to a depth E1 from the inner perimeter, and to a depth E2 from the lower surface, and is slanted at an angle θ from the lower surface. The beveled portion is preferably formed with a depth E1 of about 1 to about 10 mm, a depth E2 of about 3 to about 8 mm, and an angle θ of about 20 to about 60°.

As shown in FIG. 1, at the time of mounting the focus ring 20 to the lower electrode 16, the focus ring is fit to the lower electrode 16 such that the side surface on the inner perimeter of the focus ring 20 faces the side surface on the outer perimeter of the lower electrode 16 with a small gap in between. According to various exemplary embodiments, the focus ring 20 has a beveled portion on the lower surface along the inner perimeter. Thereby, mounting the focus ring 20 to the lower electrode 16 is facilitated. Thus, the beveled portion of the focus ring 20 does not damage the insulating coating formed on the side surface of the outer perimeter of the lower electrode 16 at the time of mounting.

Furthermore, as is explained below, the beveled portion facilitates the restoration of the focus ring 20.

According to various exemplary embodiments, the entire lower surface of the focus ring 20, i.e., the surface opposite to the main surface, is flat, except for the beveled portion. Accordingly, the first portion around the inner perimeter is formed with a larger thickness than that of the second portion around the outer perimeter of the first portion.

More specifically, both the first region A1 and the second region A2 of the focus ring 20 are made flat and parallel to the lower surface. That is, each of the first region A1 and the second region A2 has a constant thickness.

When mounted onto the lower electrode 16, as shown in FIG. 1, the first region and the second region of the focus ring 20 become parallel to the upper surface of the lower electrode, and to the upper surface of the wafer W mounted onto the lower electrode 16.

Accordingly, as also shown in FIG. 1, the first region of the focus ring 20 forms, together with the lower surface of the shield ring 18, a constant gap, which does not disturb the flow of the processing gas.

It should be noted that, the focus ring according to this invention is not limited to the configuration that the entire lower surface is formed flat and both the first region and the second region are formed flat and parallel to the lower surface. For example, an arrangement may be made, according to various exemplary embodiments, where the lower surface of the focus ring 20 is formed in various shapes corresponding to the plasma processing apparatus.

However, it is generally preferable to make the first region and the second region flat and perpendicular to the lower surface and/or to each other. Such configuration makes it easy to manufacture the focus ring.

FIG. 2 shows the example of a complete concentric circular configuration wherein the first region A1 is formed with a constant width along the entire inner-perimeter. The focus ring 20 having a region A1 with a constant width has the advantage of high uniformity of the gas flow.

In practice, the focus ring 20 is formed in a shape corresponding to the wafer W to be processed, which may have, for example, an inclined surface. Accordingly, the focus ring 20 may not be formed with a complete concentric-circular configuration. Thus, while FIG. 2 shows an example having the first region A1 with a constant width, in practice, the first region A1 may not be formed with a completely constant width.

Nonetheless, the focus ring 20 has a generally concentric circular configuration wherein the first region A1 is formed with a substantially constant width.

Next, description will be made regarding the shield ring 18, which is another exemplary embodiment of a quartz component according to this invention.

Figure 3A:
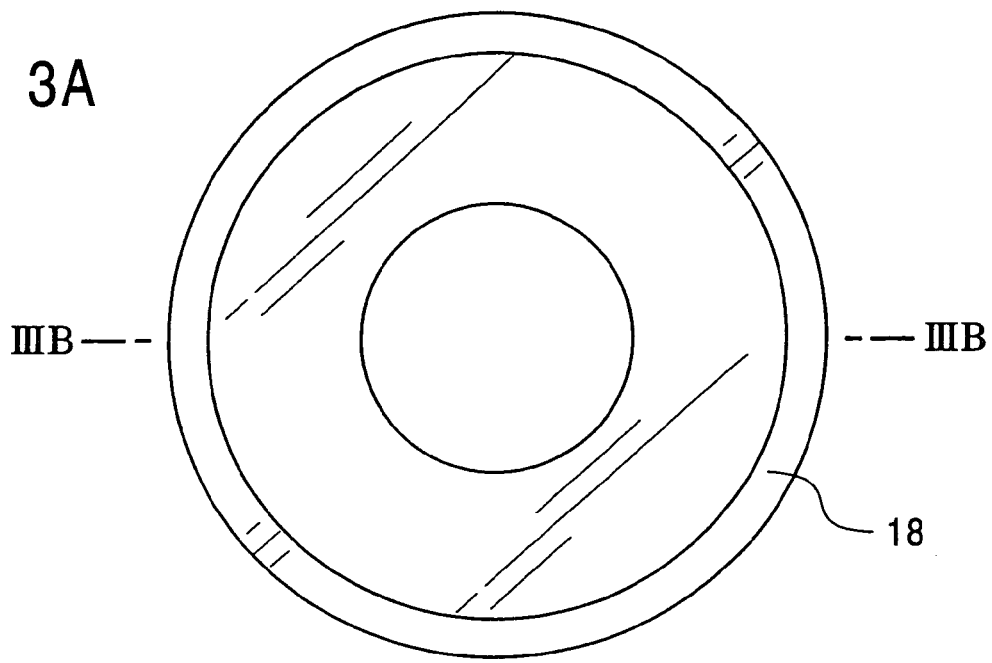
FIGS. 3A through 3C are a plan view and longitudinal cross-sectional views of a shield ring according to an aspect of the present invention.
Figure 3B:
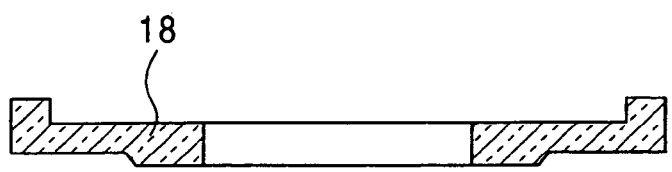
Figure 3C:
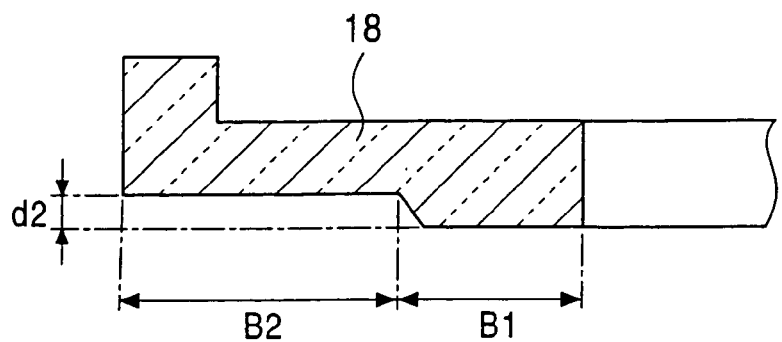

FIG. 3A is a plan view of the shield ring 18 according to various exemplary embodiments, FIG. 3B is a longitudinal cross-sectional view taken along line IIIB-IIIB in FIG. 3A, and FIG. 3C is a partially enlarged cross-sectional view of the shield ring 18.

The shield ring 18 is formed in the overall shape of a doughnut-shaped plate having an inner perimeter and an outer perimeter similarly to the focus ring 20. Furthermore, as shown in FIG. 3B, the lower surface of the shield ring 18, serving as the main surface, includes a ridge around the inner perimeter.

More specifically, as shown in FIG. 3C, the shield ring 18 includes a first portion around the inner perimeter and a second portion adjacent to the outer perimeter of the first portion. The first portion has a flat surface (first region B1) on the main surface, and the second portion also has a flat surface (second region B2) on the main surface.

The first region B1, which corresponds to the ridge, has a larger height than the second region B2, and the difference is height d2. In other words, the main surface of the shield ring 18 is divided into the first region B1 and the second region B2 by an offset d2.

Note that, in FIG. 3C, the second region B2 is positioned on the upper side of the first region B1. However, the term "height" as used here means a height from the surface opposite to the main surface (the upper surface in FIG. 3B) of the shield ring 18. Accordingly, the second region B2 is formed with a smaller height than that of the first region B1.

The shield ring 18 according to an aspect of this invention has generally the same configuration and generally the same functions as a conventional shield ring. A difference is that the main surface of a conventional shield ring is not divided into a first region B1 and a second region B2 by an offset, i.e., the entire main surface of a conventional shield ring is formed flat.

The configuration of the shield ring 18, where the main surface is divided into a first region B1 and a second region B2 by an offset d2, with the first region B1 higher than the second region B2, enables repeated restorations of the shield ring 18 without replacement.

The offset d2 is formed with a height such that restoration can be easily performed when the shied ring 18 becomes damaged due to exposure to the plasma during processing of a number of wafers W. At the same time, the height of the offset d2 does not disturb the flow of the processing gas supplied to the space between the electrodes.

Specifically, the offset d2 is preferably formed with a height of about 0.1 mm to about 2 mm, and is more preferably formed with a height of about 0.3 mm to about 1.7 mm. A smaller height of the offset d1 than this range may lead to difficulty in the restoration. On the other hand, a greater height of the offset d2 than this range may disturb the flow of etching gas, thus leading to a problem of poor uniformity during processing of the wafer W.

The main surface of the shield ring 18 is preferably divided into the first region B1 and the aforementioned second region B2 with a width ratio (in the radial direction) of about 1:0.3 to about 1:2.0. More specifically, in a case of the main surface where the sum of the width of the region B1 and the width of the region B2 is 75 mm, the main surface is preferably divided into the region B1 with a width of about 25 to about 55 mm, and the region B2 with a width of about 20 to about 50 mm.

The main surface having a region B1 with a smaller width than this range may disturb the flow of the processing gas. On the other hand, the main surface having a region B1 with a greater width than this range may lead to a problem of increased restoration costs.

Furthermore, the shield ring 18 includes a ridge on the outer perimeter on the upper surface, i.e., on the surface opposite to the main surface. As shown in FIG. 1, the ridge fits the recessed portion on the inner wall of the upper side of the chamber 12 for positioning the shield ring 18 so as to surround the outer perimeter of the upper electrode 14. This ridge on the outer perimeter also exists in conventional shield rings, and is not an essential component of this invention.

The entire surface on the upper side of the shield ring 18 is formed generally flat, except for the ridge on the outer perimeter. Accordingly, the second portion around the outer perimeter of the first portion is formed with a smaller thickness than that of the first portion around the inner perimeter of the shield ring 18, except where the outer perimeter has a the ridge on the upper side.

Also, the upper surface of the shield ring 18 may be formed in various shapes corresponding to the plasma processing apparatus.

It should be noted that while FIG. 3C shows the offset d2 in proportion not to actual scale. The offset d2 is formed with a far smaller height compared to the entire size of the main surface (lower face). Accordingly, the shield ring 18 is generally formed in the shape of a plate with a uniform thickness, and has a generally flat main surface except for the outer perimeter having a ridge on the upper side, in a similar way as with the focus ring 20.

FIG. 3 shows a shield ring 18 having a complete concentric circular configuration wherein the first region B1 is formed with a constant width along the entire inner-perimeter. The shield ring 18 having the region B1 with a constant width has the advantage of high uniformity of the gas flow.

In practice, however, the shield ring 20 is not necessarily formed with a perfectly concentric circular configuration. Even in this case, the shield ring 18 is formed with a generally concentric circular configuration wherein the first region B1 is formed with a generally constant width.

A restoration method of quartz components according to various exemplary embodiments of this invention is described below.

FIG. 4 is a flowchart that shows a flow of the restoration procedure of a quartz component according to various exemplary embodiments of this invention, and FIG. 5 is a longitudinal cross-sectional diagram that shows a quartz component being subjected to a restoration procedure. In this exemplary embodiment, description will be made regarding a restoration of the focus ring 20 as an example of quartz component.

Restoration of the focus ring 20 is performed as follows. First, quartz material is supplied to the portion that was damaged during processing of a number of wafers W. In other words, the damaged portion of the focus ring 20 is filled with quartz material (step 1).

Figure 5A:
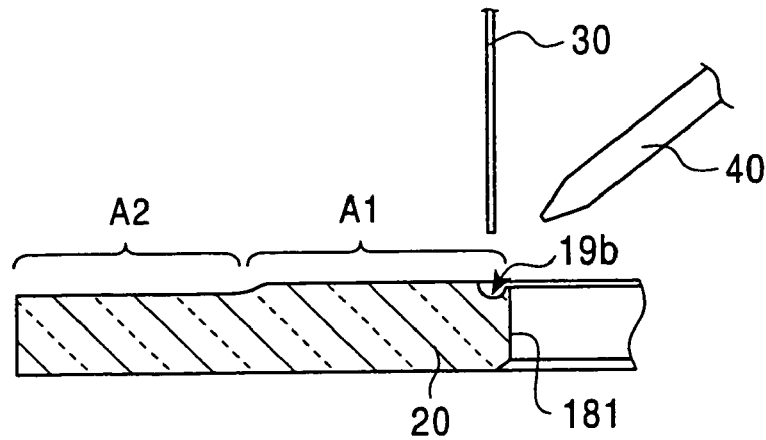
FIGS. 5A through 5D are longitudinal cross-sectional views which show the quartz component during restoring.

Specifically, as shown in FIG. 5A, a portion 19b on the upper surface (main surface) of the focus ring 20 along the inner perimeter, which is positioned near the outer perimeter of the lower electrode 16, is severely damaged during its use in the plasma etching apparatus 10. In the first stage of the restoration, quartz material is supplied to the severely damaged portion which becomes a grooved portion 19b (step 1).

The supplying method is not limited to any particular one. For example, as shown in FIG. 5A, quartz material 30 in the shape of a stick with a diameter of about 1 mm is heated and melted with an oxyhydrogen flame burner 40 so as to supply melted drops of quartz to the severely damaged portion 19b, while visually inspecting the supplying process.

Figure 5B:
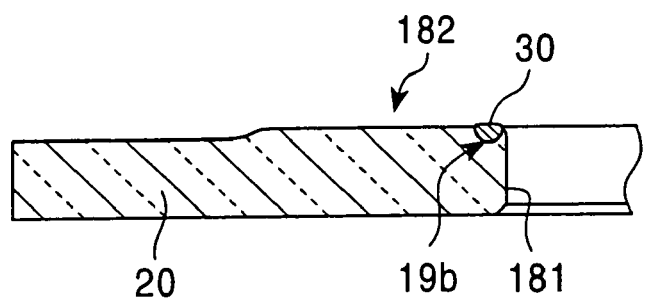

FIG. 5B show a focus ring 20 when the supply of the quartz material 30 to the severely damaged portion 19b is complete. It should be noted that the above-described supply of quartz material is performed only for severely damaged portions (grooved portion) 19b.

However, the above-described supply of quartz material to the severely damaged portion 19b alone cannot ensure the dimensional precision necessary for re-using the part in the plasma processing apparatus. Accordingly, in various exemplary embodiments, upon completion of the supply of quartz material to the severely damaged portion 19b, an excess amount of quartz material is supplied so as to form a bulge (step 2). Thereafter, the bulge is machined such that the excess quartz material is removed, thereby restoring the focus ring 20 with sufficient dimensional precision.

Figure 5C:
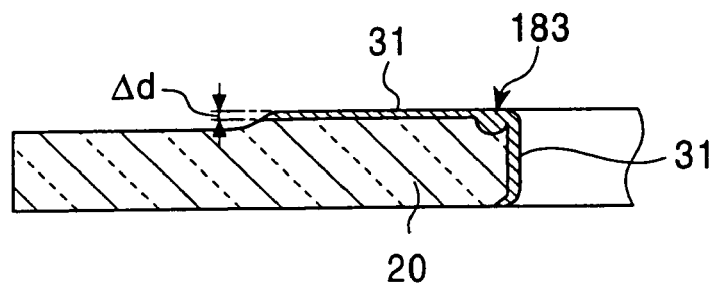

The bulge 31 is formed at and around the damaged portion of the focus ring 20, as shown in FIG. 5C. Specifically, the bulge 30a is formed on the side surface 181 of the inner perimeter, and on the first region A1 of the upper surface 182. As a method for forming the bulge 31, for example, drops of melted quartz material are supplied in the same way as the method of supply of the quartz material to the severely damaged portion 19b during step 1.

The bulge 31 is formed on the first region A1 of the upper surface 182 of the focus ring 20 so that the height of the first region A1 becomes somewhat higher, by a thickness Δd, than the required final height, as shown in FIG. 5C. The thickness Δd is determined so as to enable restoration of the first region A1 with high repeatability by machining, while not requiring an excessive amount of material and processing.

Specifically, in various exemplary embodiments, the bulge 31 is preferably formed with a thickness Δd of about 0.3 to about 3.0 mm. A bulge 31 with a thickness Δd smaller than this range may lead to difficulty in machining. A bulge 31 with a thickness Δd greater than this range may lead to a problem of excessive restoration costs.

It is to be noted that the focus ring 20 includes the beveled portion along the inner perimeter of the lower surface. Accordingly, the focus ring 20 has the advantage of preventing quartz material from flowing onto the lower surface at the time of forming the bulge of quartz 31, as schematically shown in FIG. 5C. Thus, there is generally no need for machining the lower surface.

Upon completion of the formation of the bulge 31, the focus ring 20 is annealed in order to reduce thermal distortion (step 3). Subsequently, machining is performed, whereby restoration of the first region A1 is completed (step 4).

That is, the upper surface 182 of the first region A1 is machined by grinding so as to form a flat surface. At the same time, the height of the first region A1 is adjusted to a required height, which is higher that that of the second region A2. It is to be noted that, during the grinding of the first region A1, the second region A2 is not grinded because it has a lower height than that of the first region A1.

The side surface 181 at the inner perimeter is also grinded so as to be perpendicular to the upper surface 182 while adjusting the diameter of the inner perimeter to a predetermined value. Moreover, the beveled portion is grinded in a predetermined shape. Furthermore, the edge 183 at the inner perimeter on the upper surface of the focus ring 20 is grinded such that the region A0 has a smaller height than that of the other portions of the region A1.

Figure 5D:
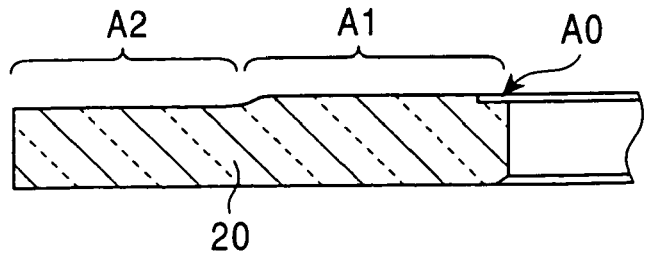

Thus, restoration of the focus ring 20 having the longitudinal cross-sectional configuration shown in FIG. 5D is complete.

As described above, during the formation of the bulge 31, the beveled portion on the lower surface prevents the quartz material from flowing onto the lower surface. Thus, there is no need for machining the lower surface. Even in the event that a small protrusion is formed downwardly beyond the lower surface due to a poor control of the process of forming the bulge 31, the protrusion can be removed during the grinding of the beveled portion.

Because there is no need to grind the lower surface, and because the second region A2 of the upper surface is not grinded during the grinding of the first region A1, undue reduction of the height of the second region A2 during the restoration procedure is prevented. As will be explained later, repeated restorations of the focus ring are enabled because the height of the second region A2 is not reduced.

According to various exemplary embodiments, the quartz material 30 is supplied to the damaged portion and on the first region A1 of the focus ring 20 to form a bulge of the quartz material 31. Subsequently, the focus ring 20 is machined by grinding to restore the configuration where the first region A1 has a predetermined height, which is larger than that of the second region A2.

Thereby, use of the focus ring 20 for an extremely long time is enabled. That is, the focus ring 20 may be used for a long time, except in cases where the focus ring 20 breaks because of other factors.

Thus, according to various exemplary embodiments, the number of in-stock replacement components required for multiple operation of a plasma processing apparatus can be reduced. As a result, reduction of the production costs, and a more effective utilization of resources are enabled.

Conventionally, restoring was never performed for focus rings, which suffer serious damage during their use in a plasma processing apparatus. Furthermore, prior attempts to restore a conventional focus ring with a flat main surface, i.e., with a configuration where the main surface is not divided into the first region A1 and the second region A2 by an offset, were not successful. That is, the number of times that the restoration can be repeated is limited to a very small number.

While description has been made for the restoration of the focus ring 20, the shield ring 18 may be restored in a similar fashion.

Furthermore, description has been made for restoring a quartz component that initially has a configuration where the main surface is divided into an inner region with a larger height than an outer region by an offset. However, it is also possible to restore a conventional quartz component. That is, a conventional quartz component having a generally flat upper surface may be subjected to this restoration method so as to be re-constructed as a focus ring with the configuration that the main surface is divided into an inner region with a larger height than an outer region by an offset, as described in the next exemplary embodiment.

Second Embodiment

Next, description will be made regarding a method for performing a cycle of use and restoration of a quartz component according to various exemplary embodiments of this invention.

FIG. 6 is a flowchart that shows a flow of a cycle of use and restoration according to various exemplary embodiments of this invention, and FIGS. 7 and 8 are longitudinal cross-sectional diagrams of a quartz component that is used during the cycle of use and restoration according to various exemplary embodiments.

According to various exemplary embodiments, the first time, a conventional focus ring having a generally flat upper surface (main surface) is used. After processing a number of wafers W, a first time restoration is performed on the focus ring such that the upper surface becomes flat for its use a second time.

After processing a number of wafers W, a second restoration is performed. This time, restoration is performed so that the focus ring is formed with a configuration where the upper surface is divided into two regions by an offset, as shown in FIG. 2.

Then, the focus ring is used again. After being used on a number of wafers W, a third restoration of the focus ring is performed in a configuration where the upper surface divided by an offset is maintained, as in the case of the exemplary embodiment shown in FIG. 5. Subsequently, the focus ring is repeatedly used and restored until the damaged focus ring cannot be restored any more.

Figure 7A:
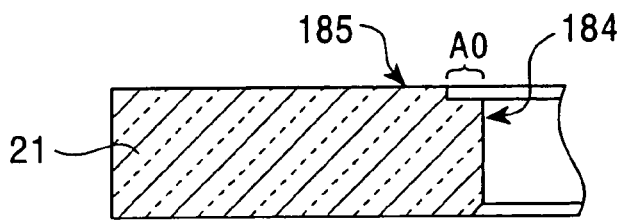
FIGS. 7A through 7H are longitudinal cross-sectional views which show the quartz components during the cycle of use and restoration according to an aspect of the present invention.

At first, the focus ring 21, having a uniform and flat upper surface 185 without an offset except for the region A0 at the edge along the inner perimeter and formed in a cross-sectional shape as shown in FIG. 7A, is mounted for use in the plasma processing apparatus 10 (step 1). The plasma processing apparatus with the focus ring 21 performs processing of a number of wafers W (step 2). Some portions of the upper surface 185, along the inner perimeter of the focus ring 21, are damaged as shown in FIG. 7B during processing of the wafers W.

Figure 7B:
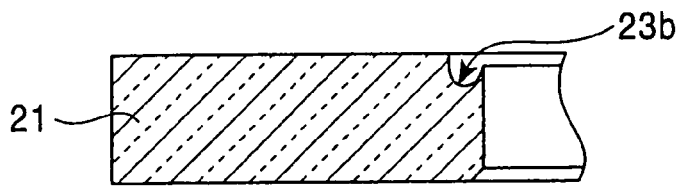
Figure 7C:
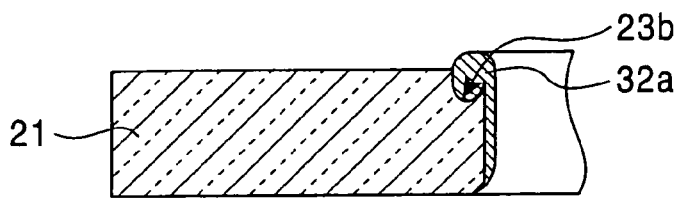

Then, melted quartz material 30 is supplied to the severely damaged portion, or the grooved portion, 23b as shown in FIG. 7B (step 3). Furthermore, an excessive amount of quartz material is supplied to the severely damaged portion 23b, and to the upper surface and to the side surface 184 of the focus ring 21, so as to form a bulge 32a around the severely damaged portion 23b as shown in FIG. 7C (step 4).

Figure 7D:
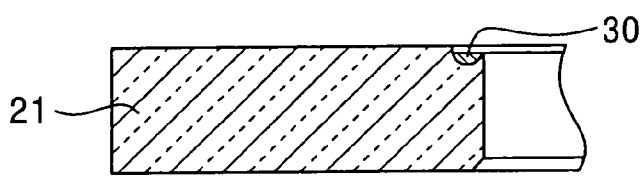

Subsequently, the focus ring 21 is annealed (step 5) so as to reduce thermal distortion occurring at the time of forming the bulge 32a. Then, the bulged portion 32a of the focus ring 21 is machined by grinding (step 6). Thereby, restoring of the focus ring 21 to a shape generally the same as a new one with the uniform and flat upper surface 185 without any offset, as shown in FIG. 7D, is completed.

During this step, the entire upper surface of the focus ring 21 is grinded uniformly so as to form a flat upper surface. Accordingly, the thickness of the focus ring 21 is reduced by about 0.1 to about 0.3 mm over the entire surface. In this state, the quartz material 30 fills the grooved portion 23b of the restored focus ring 21, as shown in FIG. 7D.

Next, the focus ring 21 thus restored is mounted onto the plasma processing apparatus (step 7), and processing of another number of wafers W is performed in the same way (step 8).

When the number of processed wafers W again reaches a certain number, the focus ring 21 is inspected to determine whether or not it can be restored (step 9). Determination is made that the focus ring 21 can be restored if it has not suffered fatal damage such as chipping, cracking, deformation, or the like, and can be restored by supplying quartz material to the damaged portion. On the other hand, determination is made that the focus ring 21 cannot be restored if it is fatally damaged and cannot be restored by simply supplying quartz material to the damaged portion.

Figure 7E:
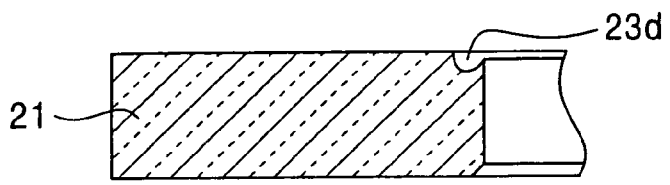
Figure 7F:
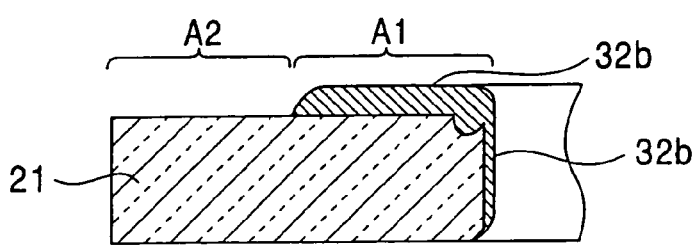

In the event that determination is made that the focus ring 21 can be restored, melted quartz material is then supplied to the grooved portion 23d shown in FIG. 7E in the same way as described above (step 10). Furthermore, the quartz material 30 is further supplied to the upper surface 185 and to the side surface of the inner perimeter such that a bulge 32b is formed as shown in FIG. 7F (step 11).

In this case, unlike the first restoration shown in FIG. 7C, the bulge 32b is formed not only around the grooved portion 23d, but also over the first region A1 with a predetermined width around the inner perimeter of the upper surface 185. Note that the bulge 32b is not formed over the entire upper surface, but is formed on a region with a predetermined width, whereby the upper surface 185 is divided into the first region A1, where the bulge 32b is formed, and the second region A2, where a bulge is not formed.

Next, the focus ring 21 is annealed so as to reduce thermal distortion (step 12). Then, the bulge 32b formed on the first region A1 of the upper surface of the focus ring 21 is machined by grinding (step 13).

Figure 7G:
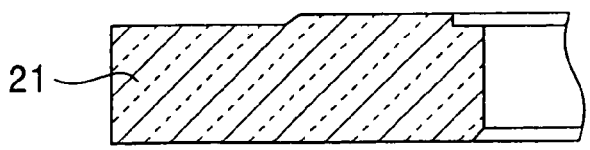

During this step, grinding is performed while maintaining the height of the first region A1 higher than the height of the second region A2, by an offset. Thereby, restoration of the focus ring 21 is completed with a configuration where the upper surface 185 is divided into the first region A1 with a larger height and the second region A2 with a smaller height, as shown in FIG. 7G.

That is, grinding is stopped when the configuration where the upper surface 185 is divided into the first region A1 and the second region A2 separated in height by an offset is achieved. Therefore, reduction of the height of the second region A2 due to grinding is prevented.

During the first restoration (steps 3 through 6), the entire upper surface of the focus ring 21 is grinded, leading to reduction of the thickness of the focus ring 21 over the entire surface as described above. Accordingly, by performing the grinding such that the height of the first region A1 matches the height of the upper surface of the new one, i.e., the thickness of the focus ring 21 before the first use, the focus ring 21 can be restored to the configuration where the height of the first region A1 is larger than the height of the second region A2 by an offset.

Figure 7H:
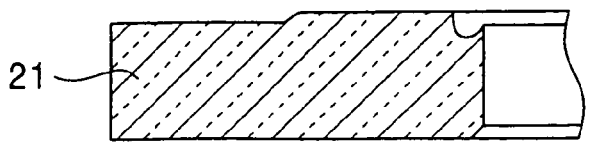

Subsequently, the restored focus ring 21 is mounted onto the plasma processing apparatus 10 (step 7). Processing of a number of wafers W is performed (steps 8) until the number of processed wafers W reaches a certain number and the focus ring 21 is damaged again as shown in FIG. 7H.

If the determination is made during the inspection (step 9) that the focus ring 21 can be restored, quartz material is supplied to the damaged portion, and a bulge 32b is formed on the upper surface 185 of the first region A1 and on the side surface 184 of the inner perimeter (steps 10 and 11) as shown in FIG. 8A. After annealing (step 12), the bulge 32b is grinded to restore the focus ring 21 to the configuration where the upper surface is divided into two regions separated in height by an offset (step 13) as shown in FIG. 8B.

Then, the cycle of use and restoration is further repeated. That is, following the third restoration, the same cycle as the one of step 7 through step 13 shown in FIG. 7H through FIG. 8B is repeated.

On the other hand, if the determination is made during step 9 that the focus ring 21 cannot be restored, then the focus ring 21 is discarded (step 14). In this case, a new focus ring 21 is mounted onto the plasma processing apparatus (step 1), and the same cycle following step 2 is performed.

As described above, the repeated use of the quartz component according to the flow shown in FIG. 6 utilizes two types of restoration methods. In the first restoration method (step 3 through step 6), the bulge 32a is formed around the severely damaged region (grooved region) 23b and the entire upper surface 185 is machined to be flat, as shown in FIGS. 7C and 7D. In this first method, the thickness of the focus ring 21 is reduced.

In the second restoration method (step 10 through step 13), on the other hand, the bulge 32b is formed on the first region A1 and is machined while maintaining a height offset between the first region A1 and the second region A2, as shown in FIGS. 7F and 7G or in FIGS. 8A and 8B. In the second method, the second region A2 is not machined, and the thickness of the focus ring 21 is not reduced.

That is, the first time, the focus ring 21 having a uniform and flat upper surface over the first region and the second region without offsets, except for the region A0 at the edge along the inner perimeter, is mounted onto the plasma processing apparatus. Following processing of a number of wafers W, the damaged focus ring 21 is restored by the first restoration method. Due to the restoration by the first method, the thickness of the focus ring 21 is reduced over the entire surface, i.e., regions A1 and A2.

The focus ring 21 restored by the first method is mounted onto the plasma processing apparatus for a second cycle of use. Following the second cycle of use, the damaged focus ring 21 is restored by the second method. As a result, the focus ring 21 is restored with a configuration where the upper surface is divided in two regions separated in height by an offset.

The focus ring restored after the second cycle of use is mounted onto the plasma processing apparatus for a third cycle of use. Subsequently, restoration of the focus ring 21 by the second method while maintaining the height offset formed during the second restoration, and use of the restored focus ring, are repeated.

According to various exemplary embodiments, at first, a focus ring having a uniform and flat upper surface without any height offsets is used. Thereby the initial purchase cost of the focus ring is reduced compared with the case where a focus ring with the upper surface divided by an offset is purchased. Furthermore, because the first time restoration is performed simply by grinding the entire upper surface, the restoration cost is also reduced.

The number of times that the restoration by the first method, which leads to the reduction of thickness the focus ring over the entire surface, can be performed is not necessarily limited to one. However, the number of times is generally small.

When the reduction of thickness of the focus ring reaches a certain value due to the repetition of the restoration by the first method, the side surface of the lower electrode becomes exposed. As a result, the insulating coating on the side surface of the lower electrode may become damaged, leading to an abnormal plasma discharge.

In addition, reduction of the thickness over the entire surface leads to a change in the flow of etching gas, leading to degradation in processing performance. Furthermore, the reduction of the thickness decreases the mechanical strength of the focus ring itself.

In some cases, however, restoration by the first method can be performed multiple times, depending on the configuration of the plasma processing apparatus and the shape of the focus ring. That is, for example, the reduction of the thickness of the focus ring obtained by performing the restoration by the first method only once may be too small. Such insufficient reduction of thickness may lead to an insufficient height of the offset between the first region A1 and the second region A2, and to inadvertent grinding of the second region during the grinding of the bulge 32b formed on the first region.

It is possible to grind the first region A1 without grinding the second region A2 even if the height of the offset is made as small as about 0.1 mm, and even if a specialized jig is not used. However, the height of the offset of about 0.3 mm or more provides a sufficient margin for the efficient grinding of the first region A1 without grinding the second region A2.

In order to prevent such inadvertent grinding of the second region A2 from happening, the restoration by the first method is repeated multiple times until the reduction of the thickness reaches a predetermined value. Thereafter, the restoration by the second method that forms the offset can be performed without the inadvertent grinding of the second region A2.

In practice, however, the number of times the restoration by the first method can be performed is limited to two or three.

After the thickness of the focus ring is sufficiently reduced by performing the restoration by the first method one or more times, on the other hand, further restoration is made by the second restoration method without reducing the thickness of the focus ring. Thus, use of the focus ring with the repeated restoration is enabled for a long time.

That is, in the first region, a bulge is formed and grinded to maintain a predetermined thickness (the thickness of a new ring). Thus, it is possible to prevent the upper electrode from suffering damage. Furthermore, the second restoration method does not reduce the thickness of the second region.

Thus, changes in the flow of processing gas and deterioration of mechanical strength of the focus ring are prevented.

Note that the second region is not exposed to high-density plasma and, therefore, is not significantly damaged during the use of the ring in the plasma processing apparatus. Accordingly, if the restoration is made without grinding the second region, the height of the second region is maintained even if the use and restoration cycles are repeated.

In practice, the cycle where a single focus ring is used and restored as shown in FIG. 6 is not performed, but two focus rings are used in turn. That is, a restored (or new) focus ring is used in the plasma processing apparatus during restoration of the damaged focus ring, thereby enabling a continuous operation of the plasma processing apparatus.

A description has been made of an example where at first, a conventional quartz component having a uniform and flat upper face is used, and is then restored so as to have a configuration where the upper surface of the quartz component is divided in two regions and separated in height by an offset. However, an arrangement may be made where a quartz component having a configuration where the upper surface is divided in two regions separated in height by an offset at the very first stage. In this case, steps 7 through 13, shown in FIG. 7G through FIG. 8B, are repeated.

Example

Description will be made below with reference to the drawings regarding the operation of an exemplary plasma processing apparatus according to this invention. The same plasma processing apparatus as shown in FIG. 1 is used.

In this example, split-coupling method for applying RF electric power to both the upper and lower electrodes was employed. In this example, as shown in FIGS. 2 and 3, quartz components (focus ring and shield ring), each having a main surface with a ridge in the shape of a circle are used.

The first region, or the ridged region, was formed with a width of 35 mm around the inner perimeter, and the main surface was divided into the first region and the second region separated in height by an offset with a height of 1 mm. Furthermore, a beveled portion of 2R is formed on the inner perimeter of the mounting surface (lower face) of the focus ring. Dry etching is performed for a silicon-dioxide film using the plasma processing apparatus 10 shown in FIG. 1.

FIG. 9 is a longitudinal cross-sectional view of the wafer W to be processed. As shown in FIG. 9, a silicon-dioxide film S2 is formed with a thickness of 1.0 μm on a silicon substrate S1, and a mask pattern M is formed of a photo-resist with a thickness of 1.2 μm. The mask pattern has openings H in the shape of a hole with a diameter of 0.30 μm. An Ar-diluted mixture of etching gases $CF_4$ and $CHF_3$ is used as the processing gas for dry etching. Table 1 shows the conditions for generating plasma.

TABLE 1

| | | Conditions for generating plasma | | | | |
|---|---|---|---|---|---|---|
| PRESSURE | RF POWER DENSITY | GAS FLOW (sccm) | | | TEMPERATURE OF LOWER ELECTRODE | TEMPERATURE OF UPPER ELECTRODE |
| (mTorr) | (W/cm²) | $CF_4$ | $CHF_3$ | Ar | (° C.) | (° C.) |
| 300 | 4.65 | 30 | 30 | 500 | −10 | 30 |

The etching properties obtained under the conditions shown in Table 1 are shown in Table 2.

TABLE 2

| | Example of etching properties | |
|---|---|---|
| ITEMS | PLASMA PROCESSING USING NEW QUARTZ COMPONENTS | PLASMA PROCESSING USING QUARTZ COMPONENTS RESTORED ONCE |
| ETCHING RATE OF SILICON DIOXIDE | 750.9 nm/min | 753.5 nm/min |
| UNIFORMITY OF ETCHING RATE OF SILICON DIOXIDE | 3.2% | 3.0% |
| ETCHING RATE OF SILICON | 96.3 nm/min | 97.0 nm/min |
| UNIFORMITY OF ETCHING RATE OF SILICON | 6.0% | 6.2% |
| PATTERN SHIFT (0.30 μm HOLE-PATTERN) | 0.005 μm | 0.007 μm |

Next, the quartz components are restored. Here, the shield ring 18 and the focus ring 20, both of which had been used for an accumulated RF discharge time of 300 hours, are restored.

Following removal of foreign material adhered onto the shield ring 18 and the focus ring 20, bulges of quartz material are formed on the first region of the main surface (the lower surface of the shield ring 18, and the upper surface of the focus ring 20) and on the side surface of the inner perimeter. After the components were annealed, grinding is performed to restore the shied ring 18 and the focus ring 20.

Here, grinding is not performed for the second region on the outer side of the main surface, thereby enabling the second region to remain unchanged.

Next, the restored shield ring 18 and the focus ring 20 are again mounted in the plasma processing apparatus 10. Etching characteristics were measured using the wafer W with the same cross-sectional configuration as shown in FIG. 9, and under the same etching conditions as shown in Table 1. The results are shown in Table 2, as well.

The change in the etching characteristics due to the restoration of the quartz components (the shield ring 18 and the focus ring 20) were found to be within an acceptable range of variation during normal processing, which is a level that does not present any problems during the production of semiconductor devices. Furthermore, it is confirmed that the plasma processing using the restored quartz components does not present a problem of unwanted particle generation.

According to this example, the ridges were formed on the main surfaces of the shield ring 18 and focus ring 20 as follows. That is, as shown in FIGS. 7F and 7G, a bulge of quartz material was formed on the region (first region) on the flat main surface around the inner perimeter such that the main surface is divided into the first region and the second region separated in height by an offset. Then, grinding is performed so as to maintain the offset, whereby formation of the ridge on the main surface is completed.

The first region is intended to be formed with a uniform width. Because the bulge is formed by manual work, however, the width of the first region has relatively large irregularities of around ±1 to around ±2 mm.

That is, the first region is not formed with exactly a uniform width. However, even in this case, the plasma processing using the restored shield ring and focus ring exhibited excellent etching characteristics, comparable to plasma processing using a conventional shield ring and a focus ring having flat main surfaces.

While description has been made regarding an example of quartz components subjected to restoration only once, even in the event where restoration of the components is repeated multiple times, the restored quartz components present the same advantages. That is, for example, the restored focus ring prevents abnormal discharge due to exposure of the side surface of the lower electrode to plasma. Therefore, repeated restoration and use of the quartz components for a long time is enabled.

While description has been made regarding an example of the focus ring 20 having a beveled portion of 2R on the mounting surface, the shape of the beveled portion is not limited to this example. Rather, an arrangement may be made with beveled portions of various shapes as long as the beveled portions expand the opening for facilitating the mounting of the focus ring 20 onto the lower electrode 16 without damaging the insulating coating.

Comparative Example

Next, description will be made regarding a comparative example to facilitate understanding of some advantages of this invention. The plasma processing apparatus 10 shown in FIG. 1 was also used for this comparative example.

Conventional shield ring and focus ring having uniform and flat main surfaces were mounted in the plasma processing apparatus 10, and reactive plasma was generated so as to process wafers W. The wafer W had the same configuration as shown in FIG. 9. The same conditions for generating plasma as shown in the Table 1 were employed as well.

Figure 10A:
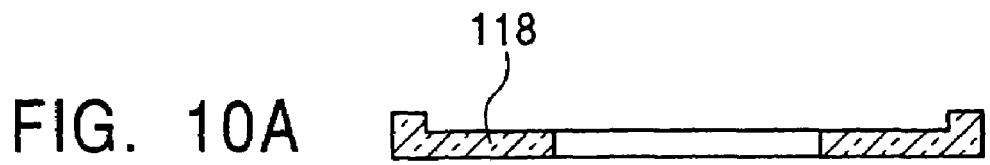
FIGS. 10A through 10E are longitudinal cross-sectional views which show damaged conventional shield rings and focus rings.
Figure 10B:
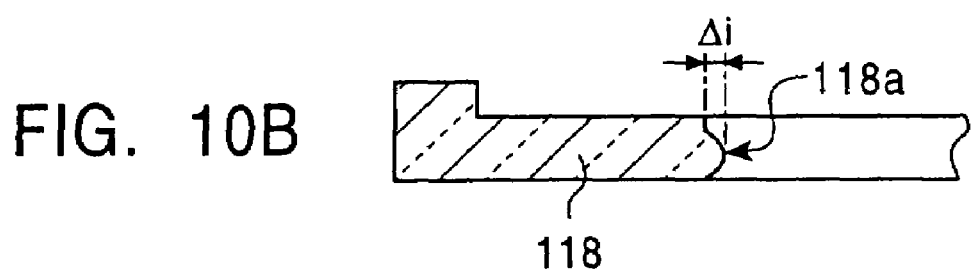
Figure 10C:
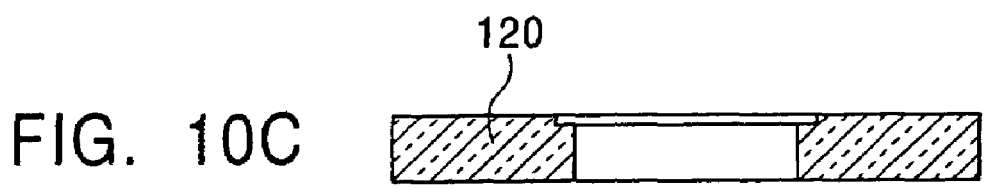

FIG. 10A is a longitudinal cross-sectional view of a conventional shield ring 118 before it is used, and FIG. 10B is a partially magnified longitudinal cross-sectional view of the shield ring 118 damaged due to its use during an accumulated RF discharge time of 300 hours. FIG. 10C is a longitudinal cross-sectional view of a conventional focus ring 120 before it is used, and FIG. 10D is a partially magnified longitudinal cross-sectional view of the focus ring 120 damaged due to its use during an accumulated RF discharge time of 300 hours.

For the shield ring 118, corrosion occurred on the side surface 118a of the inner perimeter in the horizontal direction. The maximum amount of corrosion Δi was measured, as shown in FIG. 10B. In this case, corrosion occurred at a rate of 35 nm/min.

Figure 10D:
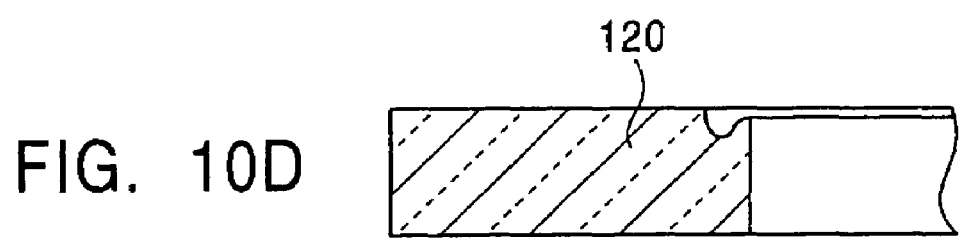

For the focus ring 120, corrosion occurred at a portion near the inner perimeter of the upper surface in a direction perpendicular to the upper surface, as shown in FIG. 10D. That is, the corrosion occurred at a region that is exposed to the plasma during processing of the wafer W and that surrounds the lower electrode and the outer perimeter of the wafer W mounted on the lower electrode. In this case, corrosion of the focus ring 120 occurred in a perpendicular direction at the rate of 55 nm/min.

A maximum acceptable amount of corrosion of the shield ring 118 is about 1 mm in the horizontal direction. A shield ring 118 damaged beyond this amount of corrosion causes particle generation during plasma processing. Accordingly, the duration of use of the shield ring 118 is reduced to around 450 to 500 hours.

On the other hand, a maximum acceptable amount of corrosion of the focus ring 120 is about 1 mm in the vertical direction. The corrosion of the focus ring 120 occurs in the shape of a circular groove, so that the remaining quartz forms a bank around the inner perimeter.

Figure 10E:
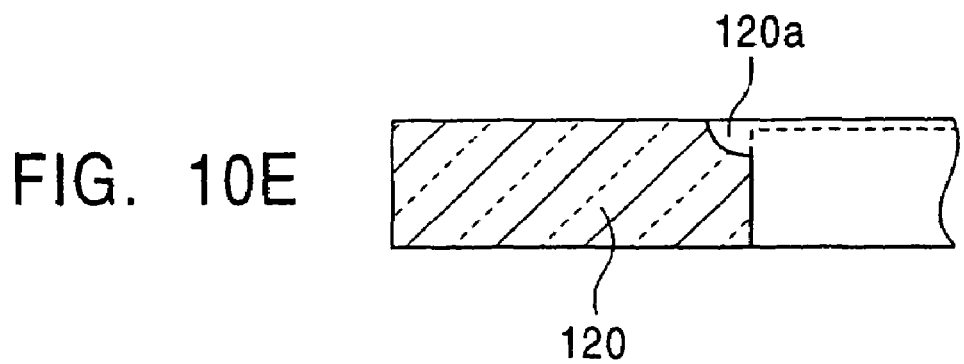

The corrosion of the shield ring 120 beyond this maximum amount leads to insufficient mechanical strength of the bank formed of the remaining quartz, leading to local chipping, i.e., leading to generation of a chipped portion 120a, as shown in FIG. 10E.

The chipping of the side surface of the inner perimeter of the focus ring 120 leads to exposure of the side surface of the lower electrode to plasma. As a result, the insulating coating formed on the side surface of the lower electrode is damaged, leading to a problem of abnormal discharge. Accordingly, the duration of use of the focus ring 120 is reduced to around 300 hours.

The quartz components such as the shield ring 118 and the focus ring 120, which reached their predetermined duration of use, were subjected to restoration, including formation of a bulge, grinding, and the like. When restoring the conventional quartz component having the uniform and flat main surface as shown in FIGS. 10A and 10C, grinding is performed over the entire upper surface in order to make the main surface flat.

Accordingly, restoration of the conventional quartz component, such as the shield ring 118 or the focus ring 120, leads to a reduction of the thickness over the entire surface. In the normal grinding process, the reduction of the thickness was 0.3 mm, including the margin of error of machining.

In this case, in particular, reduction of the thickness of the focus ring poses a serious problem. Reduction of the thickness of the focus ring leads to a problem where the focus ring loses the ability to protect the side surface of the lower electrode. A maximum acceptable amount of reduction of the thickness of the focus ring 120 is about 0.6 mm. Accordingly, the maximum number of times that the focus ring 120 can be restored for reuse is only two times.

Similarly, other quartz components such as the shield ring 118, and the like, can only be restored for reuse for a limited number of times.

Next, the influence of the height offset on the main surfaces of the quartz component on the process characteristics was examined.

The quartz components (shield ring, focus ring) had longitudinal cross-sectional configuration as shown in FIGS. 2 and 3. In both the shield ring and the focus ring, the main surface was divided into the first region and the second region, wherein the first region was formed with a width of 35 mm from the inner perimeter. The main surface was divided into the first region and the second region by a height offset of 0.3 to 3.0 mm. That is, the quartz component had the first region with a greater height than that of the second region by this range of height offset.

FIG. 11 shows measured results of etching characteristics obtained from the plasma processing apparatus 10 with the quartz components with various height offsets.

Figure 11A:
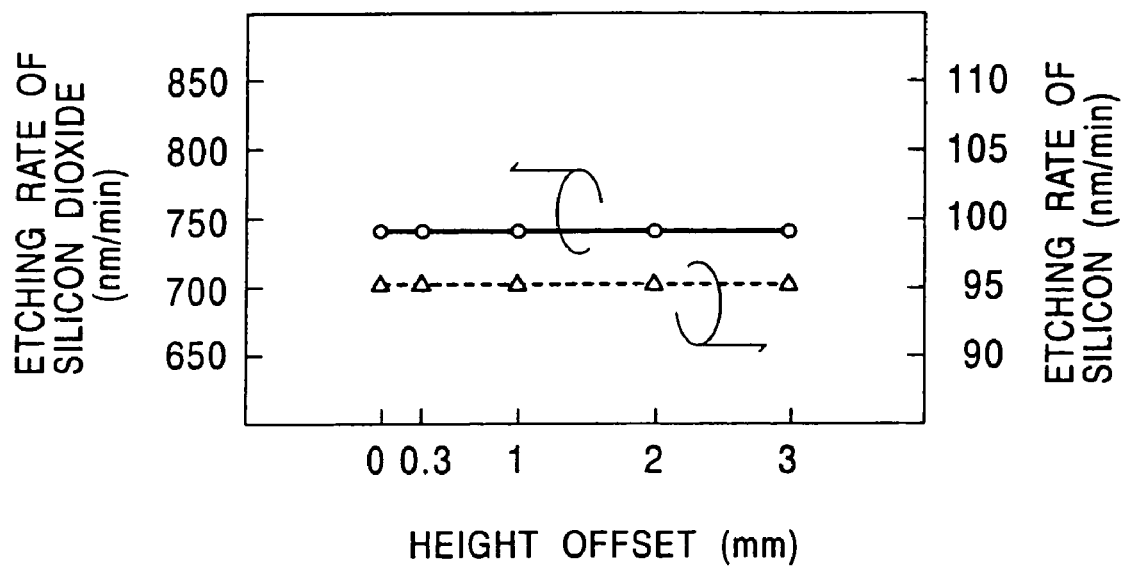
FIGS. 11A and 11B are charts which show the relation between the offset formed on the face of the quartz component and the etching performance.
Figure 11B:
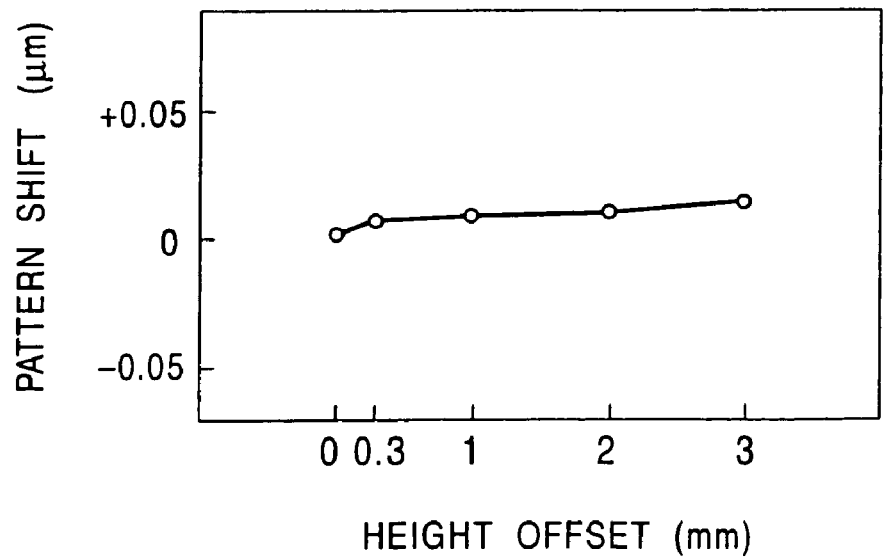

FIG. 11A shows the etching rate of silicon dioxide and that of silicon in relation to the height of the offset, which divides the main surface into the first region and the second region. FIG. 11B shows an amount of pattern shift (difference between the dimension of the resist mask M and that of the hole formed by the etching of the silicon dioxide film S2 using the resist mask) for the 0.3 μm-diameter hole in relation to the height of the offset.

The etching rates and the pattern shift shown in FIG. 11 are the most important characteristics for etching of silicon dioxide films. It can be understood that an offset with a height of up to 3 mm does not substantially affect the etching properties.

Note that the characteristics shown in FIG. 11 are measured for an Ar-diluted plasma processing gas shown in Table 1. Generally, the flow of etching gas readily affects processing characteristics using a He-diluted plasma compared with that using an Ar-diluted plasma. Accordingly, the same characteristics were measured under the processing conditions shown in Table 3.

mounting and detaching the focus ring 20, thereby extending the duration of use of the lower electrode 16.

While description has been made regarding examples wherein this invention is applied to a dry etching apparatus, applications of this invention are not limited to those examples. Rather, this invention may be applied to various types of plasma processing apparatuses.

For example, in a chemical vapor deposition (CVD) apparatus, plasma etching is performed in order to remove deposited material adhered to the surface of the component inside the chamber. Accordingly, this invention can be effectively applied to quartz components in CVD apparatuses that suffer plasma damage during plasma etching operations.

In the above-described examples, description has been made regarding cases where this invention is applied to the focus ring and the shield ring of a plasma processing apparatus for processing circular semiconductor wafers. In this case, each of the focus ring and the shield ring is formed in substantially the shape of a doughnut. The quartz components according to this invention are not limited to doughnut-shaped components.

TABLE 3

| Conditions for generating plasma (He-diluted plasma) | | | | | |
|---|---|---|---|---|---|
| PRESSURE | RF POWER DENSITY | GAS FLOW (sccm) | | | TEMPERATURE OF LOWER ELECTRODE | TEMPERATURE OF UPPER ELECTRODE |
| (mTorr) | (W/cm$^2$) | $CF_4$ | $CHF_3$ | He | (° C.) | (° C.) |
| 300 | 4.65 | 30 | 30 | 500 | −10 | 30 |

Figure 12A:
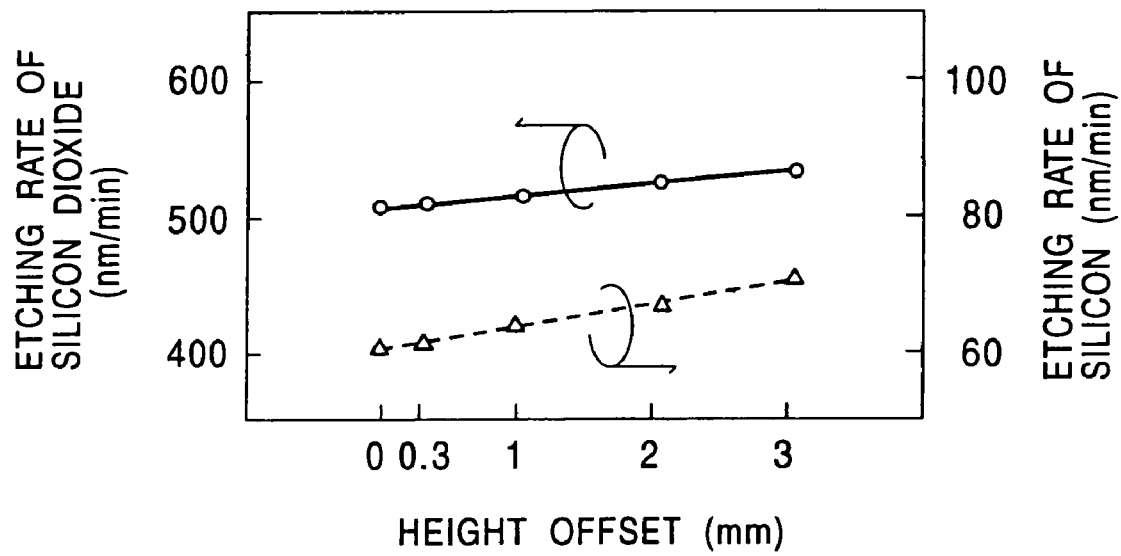
FIGS. 12A and 12B are charts which show the relation between the offset formed on the face of the quartz component and the etching performance.
Figure 12B:
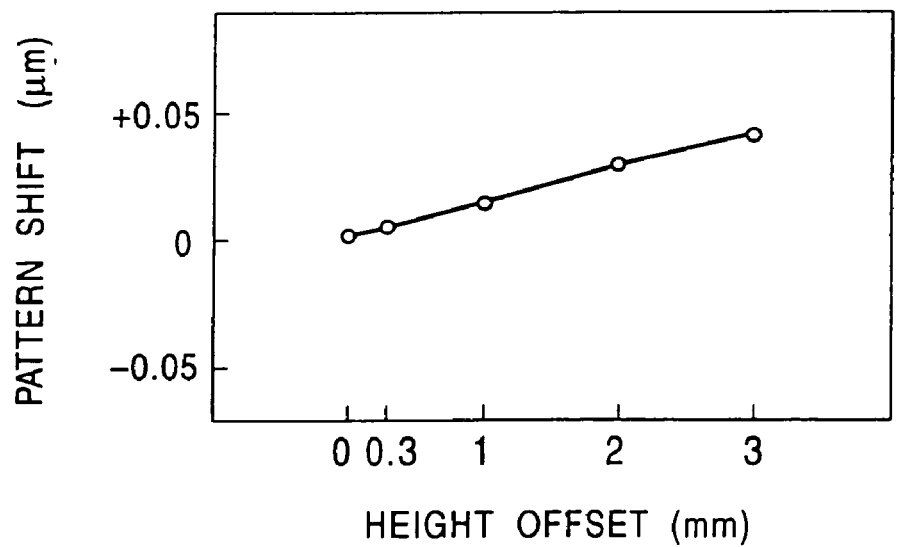

FIG. 12 shows measured results of etching characteristics obtained under the processing conditions shown in Table 3. FIG. 12A shows the relation between the height offset, which divides the main surface into the first region and the second region, and the etching rate of silicon dioxide and that of silicon. FIG. 12B shows the relation between the height offset and the pattern shift for the 0.3 μm-diameter hole.

As can be understood from the measured results shown in FIGS. 12A and 12B, the greater the height offset, the greater the etching rates of silicon dioxide and silicon, and the pattern shift. It can be also understood that the height offset is preferably formed at about 2 mm or less for the purpose of suppressing the pattern shift to about 10%.

As described above, the height offset is preferably formed at about 2 mm or less for the purpose of not affecting the processing performance in various types of plasma processing. On the other hand, as described above, the minimal height offset is about 0.1 mm, and is preferably about 0.3 mm or more for realizing stable and long term use by repetition of restoration taking into account a margin of error of grinding.

As described above, the quartz component according to this invention has a configuration in which the region that readily suffers damage is formed in the shape of a ridge, and accordingly, long term use can be achieved by repeated restoration. As a result, the operating costs are reduced, and the efficiency of utilization of resources is improved.

Furthermore, as shown in FIG. 2B, the focus ring 20 includes a beveled portion on the inner perimeter of the mounting surface (lower surface). The beveled portion prevents the lower electrode 16 from suffering damage during For example, rectangular frame-shaped quartz components are employed for the plasma processing apparatus for processing rectangular substrates for liquid crystal display devices.

In the above-described examples, description has been made regarding cases where the quartz components, and the restoration methods according to this invention, are applied to the quartz components in a plasma processing apparatus in which radio frequency (RF) electric power is applied to both the upper electrode and the lower electrode of the parallel-plate electrodes.

As described above, the inner perimeter of the main surface of the quartz component, which surrounds the outer perimeter of the parallel-plate electrodes, is seriously damaged due to exposure to plasma. Accordingly, this invention is greatly advantageous.

In particular, the quartz component or components that surrounds one or both of the electrodes to which the electric power is applied is (are) severely damaged due to irradiation by ions accelerated by bias voltage induced on the electrode(s) to which the electric power is applied. This invention is particularly advantageous to be applied in such severely damaged components.

That is, in the case of the plasma processing apparatus employing a split-coupling configuration, it is advantageous to apply this invention to both of the quartz components that surround the upper and lower electrodes. In the case of the plasma processing apparatus employing the anode-coupling configuration, it is particularly advantageous to apply this invention to the quartz component that surrounds the upper (anode) electrode. In the case of a plasma processing apparatus employing a cathode-coupling configuration, it is particularly advantageous to apply this invention to the quartz component that surrounds the lower (cathode) electrode.

The arrangement to which this invention is applied is not limited to the quartz components that surround the outer perimeters of the upper and lower electrodes of the parallel-plate plasma processing apparatus.

Plasma processing apparatus, such as ECR (Electro Cyclotron Resonance) plasma processing apparatus, ICP (Inductively Coupled Plasma) plasma processing apparatus, or the like, do not have an electrode corresponding to the upper electrode. Even in such plasma processing apparatus, RF electric power is applied to the lower electrode for mounting a workpiece to be processed, as well, in order to control the bias voltage, for example. Accordingly, the quartz component, and the restoration method according to this invention are preferably applied to the component that surrounds the outer perimeter of the lower electrode.

What is claimed is:

1. A method of restoring a plate-shaped quartz component used in a plasma processing apparatus, the quartz component comprising a main surface, the method comprising:
    forming a bulge of quartz material on a first region of the main surface such that the main surface is divided into the first region and a second region adjacent to the first region by an offset; and
    machining the main surface having the bulge such that a flat surface is formed in the first region while maintaining the offset.

2. The method according to claim 1, wherein:
    the machining is performed by grinding; and
    a height of the offset remaining after the machining is sufficient to prevent an inadvertent grinding of the second region during the machining.

3. The method according to claim 2, wherein the height of the offset remaining after the machining is not smaller than about 0.3 mm.

4. The method according to claim 1, wherein the offset is formed by the forming of the bulge of quartz material on a flat portion of the main surface.

5. The method according to claim 1, wherein the bulge of quartz material is formed on the first region of the main surface which has been already divided from the second region by the offset.

6. The method according to claim 1, wherein:
    the component further comprises a second surface opposite to the main surface, the second surface having a beveled portion along an inner perimeter of the component;
    the forming of the bulge of quartz material further forms the bulge of quartz material on a side surface of the inner perimeter of the component; and
    the beveled portion prevents the quartz material from flowing onto the second surface during the formation of the bulge on the side surface.

7. The method according to claim 1, wherein the main surface of the component extends outwardly from an inner perimeter of the component and the first region of the main surface is formed around the inner perimeter.

8. A method for manufacturing semiconductor devices, comprising:
    mounting a plate-shaped quartz component in a plasma processing apparatus, the component having a main surface;
    processing a number of semiconductor wafers in the apparatus, while exposing the main surface of the quartz component to a plasma;
    restoring the quartz component damaged by the exposure to the plasma, the restoring including:
        forming a bulge of quartz material on a first region of the main surface such that the main surface is divided into the first region and a second region adjacent to the first region by an offset; and
        machining the main surface having the bulge such that a flat surface is formed in the first region while maintaining the offset; and
    re-mounting the restored quartz component in the plasma processing apparatus and processing another number of semiconductor wafers in the apparatus.

9. The method according to claim 8, wherein the plasma processing apparatus comprises an electrode to which an electric power is supplied to generate the plasma, and the component surrounds an outer perimeter of the electrode.

10. The method according to claim 8, wherein:
    the plasma processing apparatus comprises a second plate-shaped component having a second main surface, the second main surface faces the flat surface in the first region of the re-mounted component to form a gap between them; and
    a height of the offset remaining after the machining is not substantially larger than the gap.

11. The method according to claim 8, wherein
    the processing of another number of semiconductor wafers includes supplying a processing gas:
    the plasma processing apparatus comprises a second plate-shaped component having a second main surface, the second main surface faces the flat surface in the first region of the re-mounted component to form a path to guide a flow of the processing gas; and
    a height of the offset remaining after the machining does not significantly disturb the flow of the processing gas.

12. The method according to claim 8, wherein the main surface of the component extends outwardly from an inner perimeter of the component and the first region of the main surface is formed around the inner perimeter.

13. A method of using and restoring a plate-shaped quartz component, comprising:
    using the component in a plasma processing apparatus, a main surface of the component comprising a first region and a second region adjacent to the first region, the main surface being flat throughout the first region and the second region, the using including exposing the main surface of the component to a plasma;
    restoring the used component including forming a bulge of quartz material on a portion of the main surface, and machining the main surface having the bulge such that the main surface becomes flat throughout the first region and the second region;
    re-using the restored component in the apparatus including exposing the main surface of the component to the plasma;
    re-restoring the re-used component including forming a bulge of quartz material on the first region such that the main surface is divided into the first region and the second region by an offset, and machining the main surface having the bulge such that a flat surface is formed in the first region while maintaining the offset.

14. The method according to claim 13, further comprising following the re-restoring of the component, repeating the re-using and the re-restoring of the component.

15. The method according to claim 13, further comprising before the re-restoring of the component, repeating the using and the restoring of the component two or more times.

16. The method according to claim 13, wherein:
- a height of the main surface of the component after the restoring is lower than that of the main surface of the component prior to the using; and
- a height of the flat surface in the first region formed by the re-restoring is substantially the same as that of the main surface of the component prior to the using.

* * * * *